United States Patent
Kim

[11] Patent Number: 6,114,213
[45] Date of Patent: Sep. 5, 2000

[54] FABRICATION METHOD FOR A CAPACITOR HAVING HIGH CAPACITANCE

[75] Inventor: Dong Sun Kim, Seoul, Rep. of Korea

[73] Assignee: Hyundai Electronics Industries Co., Ltd., Kyoungki-do, Rep. of Korea

[21] Appl. No.: 09/431,048

[22] Filed: Nov. 1, 1999

[30] Foreign Application Priority Data

Jan. 20, 1999 [KR] Rep. of Korea .................. 99/1659

[51] Int. Cl.⁷ ............................................ H01L 21/8222
[52] U.S. Cl. ...................................... 438/329; 438/396
[58] Field of Search ................................... 438/253, 254, 438/255, 256, 396, 397, 398, 399, 190, 171, 239

[56] References Cited

U.S. PATENT DOCUMENTS

| | | | |
|---|---|---|---|
| Re. 36,261 | 8/1999 | Chin et al. ............................... | 438/329 |
| 5,223,448 | 6/1993 | Su ............................................ | 438/398 |
| 5,326,714 | 7/1994 | Liu et al. ................................. | 438/254 |
| 5,374,576 | 12/1994 | Kimura et al. .......................... | 438/397 |

*Primary Examiner*—David Nelms
*Assistant Examiner*—Dung A Le

[57] ABSTRACT

A fabrication method for a capacitor having high capacitance that increases capacitance of a capacitor and consequently decreases defective semiconductor devices includes: forming a doped first polysilicon layer pattern on a semiconductor substrate; forming a silicide film pattern on the first polysilicon layer pattern; annealing the semiconductor substrate; sequentially forming a first insulating film and a second insulating film over the silicide film pattern; forming a contact hole to expose a portion of the silicide film pattern and then sequentially placing the semiconductor substrate in an etchant solution and a buffered etchant solution to remove a portion of the first insulating film formed on the silicide film pattern; forming a first capacitor electrode on a portion of an upper surface of the second insulating film pattern and the silicide film pattern, and at inner walls of the contact hole; and forming a dielectric layer on an outer surface of the lower electrode and then a second capacitor electrode.

16 Claims, 2 Drawing Sheets

FABRICATION METHOD FOR A CAPACITOR HAVING HIGH CAPACITANCE

BACKGROUND OF THE INVENTION

1. Field of the Invention

The present invention relates to a fabrication method for a semiconductor device, and more particularly to an improved fabrication method for a capacitor having high capacitance.

2. Description of Conventional Art

In the field of semiconductor manufacturing, attention has been focused on improving the integration of semiconductor devices. Accordingly, the size of semiconductor devices has been reduced to achieve a certain level of integration. However, such size reduction causes problems because capacitance of capacitors in the devices decreases. Therefore, attempts have been made to fabricate a capacitor having high capacitance and occupying a relatively small area on a semiconductor substrate in the fabrication of a semiconductor device. As an example of a capacitor with high capacitance, a stacked capacitor has been developed which is fabricated by contacting a node electrode with impurity layers of a semiconductor substrate, extending the node electrode above a gate electrode, and forming a dielectric layer and a plate electrode on the node electrode. Also, a fin-type capacitor is commonly used since it is a type of stacked capacitor.

FIG. 1G illustrates a conventional fin-type capacitor, wherein a gate electrode 3 is formed by applying a gate insulating film 2 on a semiconductor substrate 1. Impurity layers 4 are formed on an upper surface of the substrate 1 at both sides of the gate electrode 3. In such a capacitor, one of the impurity layers 4 is connected with a node electrode 30 of the capacitor, the node electrode 30 extending over a part of the gate electrode 3. Further, a dielectric layer 31 and a plate electrode 32 are formed on an external surface of the node electrode 30.

FIG. 1A shows the semiconductor substrate 1 and other various elements before forming the fin-type capacitor illustrated in FIG. 1G. More particularly, the gate insulating film 2 and the gate electrode 3 are formed on the semiconductor substrate 1, and the impurity layers 4 are formed on the semiconductor substrate 1 at both sides of the gate electrode 3.

FIG. 1B illustrates that a first insulating film 5 is formed on the structure of FIG. 1A. Then, a multi-layer 10 is formed on the first insulating film 5. The multi-layer 10 includes a second insulating film 6, a first polysilicon film 7 and a third insulating film 8. Here, the second insulating film 6 and the third insulating film 8 are formed of material which has great etching selectivity relative to the first polysilicon layer 7, such as a silicon oxide film deposited by chemical vapor deposition (CVD).

Next, the structure of FIG. 1C is formed by forming a contact hole 20 by etching the multi-layer 10 and the first insulating film 5 formed on the impurity layer 4, thereby exposing the impurity layer 4. Then, by forming a second polysilicon layer 9 on the structure of FIG. 1C, the structure of FIG. 1D is obtained wherein the second polysilicon layer 9 covers the impurity layer 4 and an inner wall of the contact hole 20, thereby being electrically connected to the first polysilicon layer 7. Then, as shown in FIG. 1E, the second polysilicon layer and the multi-layer 10 are patterned by dry-etching using a mask (not shown) to form a node electrode of the capacitor. In FIG. 1F, a node electrode 30 of the fin-type capacitor is formed by removing the third insulating film 8 and the second insulating film 6 by wet-etching, thus leaving only the first and second polysilicon layers 7, 9. Finally, as shown in FIG. 1G, a dielectric layer 31 is formed over the node electrode 30 of the capacitor. The dielectric layer 31 is formed, for example, by depositing a silicon nitride ($Si_3N_4$) film over the structure of FIG. 1F. Here, when using CVD, the dielectric layer 31 may be formed in the space between the first and second polysilicon layers 7, 9 which constitute the node electrode 30 of the capacitor.

Another example is to form the dielectric layer 31 by oxidizing the first and second polysilicon layers 7, 9 forming the capacitor node electrode 30. Next, the plate electrode 32 is formed on the dielectric layer 31, the plate electrode 32 being formed of a polysilicon layer. Here, also the plate electrode 32 is applied using CVD.

In such a conventional fin-type capacitor, as a design rule of the semiconductor device decreases, an align margin in the process is reduced due to the limitation of resolution of a lithography process. Also, when removing the insulating layer formed between the polysilicon layers by wet-etching, the polysilicon layers formed at upper and lower portions of the insulating layer may be undesirably also removed, which increases the number of defective semiconductor devices due to the removal of material from the fins of the device.

SUMMARY OF THE INVENTION

Accordingly, the present invention is directed to an improved fabrication method for a fin-type capacitor which obviates the problems and disadvantages in the conventional art.

To achieve these and other advantages and in accordance with the purpose of the present invention, as embodied and broadly described, a fabrication method for a capacitor having high capacitance is provided, generally including:

forming a first insulating film over a semiconductor substrate including an impurity region;

forming a first contact hole in the first insulating layer over the impurity layer;

forming a stacked polysilicon-silicide pattern in a location corresponding to the first contact hole on the insulating layer, and doping the polysilicon layer;

forming a second insulating film over the stacked polysilicon-silicide pattern and the first insulating film;

forming a third insulating film over the second insulating film;

forming a second contact hole in the second and third insulating films to thereby expose a portion of the stacked polysilicon-silicide film pattern and then forming second and third insulating film patterns;

removing a portion of the second insulating film pattern adjacent to the contact hole for form a space between the silicide film pattern and the third insulating film;

forming a first capacitor electrode on the stacked polysilicon-silicide film pattern including a portion of an upper surface of the second insulating film pattern and inner walls of the space between the silicide pattern on the third insulating film and of the second contact hole;

forming a dielectric layer on an outer surface of the first capacitor electrode; and forming a second electrode over the dielectric layer.

BRIEF DESCRIPTION OF THE DRAWINGS

The accompanying drawings, which are included to provide a further understanding of the invention and are incor- In the drawings.

DETAILED DESCRIPTION OF THE INVENTION

Reference will now be made in detail to the preferred embodiment of he present invention, examples of which are illustrated in the accompanying drawings.

FIGS. 2A through 2G sequentially illustrate a fabrication method for a capacitor having high capacitance according to the present invention in cross-sectional views. Here, it is noted that the fabrication method of the capacitor according to the present invention is not limited only to fabricating a capacitor in a DRAM cell, but also can be applied to all other types of semiconductor devices which include capacitors in the conventional art.

Figure 1A:
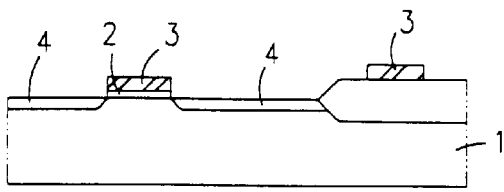
FIGS. 1A through 1G are vertical cross-sectional diagrams sequentially illustrating a conventional fabrication method for a fin-type capacitor.
Figure 1B:
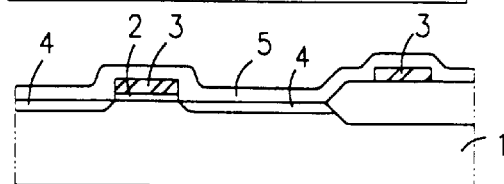
Figure 1C:
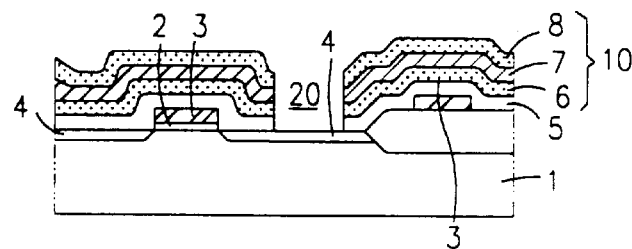
Figure 1D:
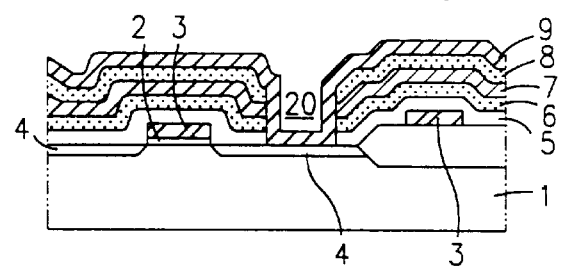
Figure 1E:
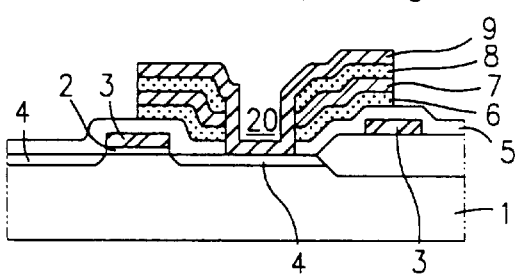
Figure 1F:
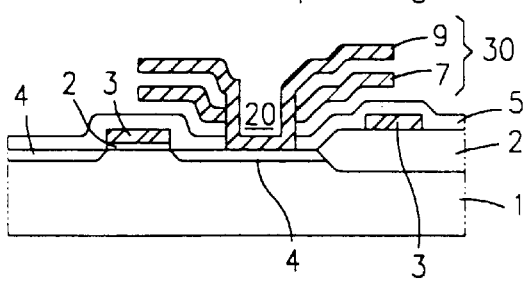
Figure 1G:
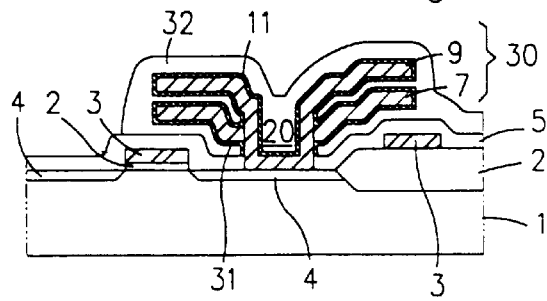
Figure 2A:
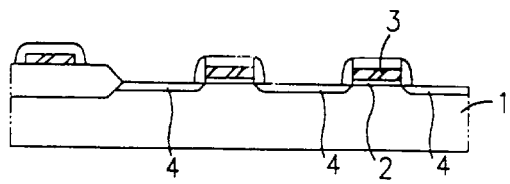
FIGS. 2A through 2G are vertical cross-sectional diagrams sequentially illustrating a fabrication method according to the present invention for a capacitor fin-type having high capacitance.

First, as shown in FIG. 2A, a gate insulating film 2 and a gate electrode 3 are formed on an upper surface of a semiconductor substrate 1. Impurity layers 4 are then formed on the semiconductor substrate 1 at both sides of the gate electrode 3, each impurity layer 4 generally being referred to as a source or a drain.

Figure 2B:
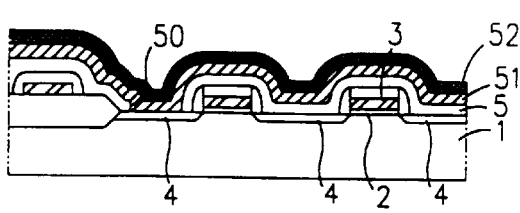

Next, as shown in FIG. 2B, a first insulating film 5 is formed over the structure of FIG. 2A, then partially removed to thereby form a first contact hole 50 over a predetermined portion of the impurity layer 4. Further, a first polysilicon layer 51 is formed over the structure by CVD. That is, the first polysilicon layer 51 is formed in the first contact hole 50 and over the insulating film 5. Then, As$^+$ is implanted into the first polysilicon layer 51 at 80 KeV to reduce the contact resistance between the first polysilicon layer 51 and other contacting layers. Such ion implantation is performed at a dose ranging between $1\times10^{16}$ and $5\times10^{16}$ atoms/Cm$^2$. Next, a natural oxide film formed on the first polysilicon layer 51 is removed if necessary and then a tungsten silicide (WSi$_x$) film 52 is deposited over the first polysilicon layer 51. The tungsten silicide film 52 is formed by using SiH$_4$ and WF$_6$ and low-temperature CVD at a temperature of 350–400° C., followed by annealing for 30 minutes in an atmosphere of N$_2$ while maintaining a temperature of the semiconductor substrate at a temperature of 850–950° C. During this process, As$^+$ doped in the first polysilicon layer 51 diffuses to the tungsten silicide film 52.

Figure 2C:
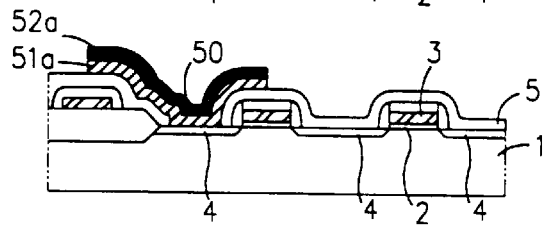

In FIG. 2C, by patterning the first polysilicon layer 51 and the tungsten silicide film 52, a first polysilicon layer pattern 51a and a tungsten suicide film pattern 52a are formed only on a part of the upper surface of the insulating film 5, around the first contact hole 50.

Figure 2D:
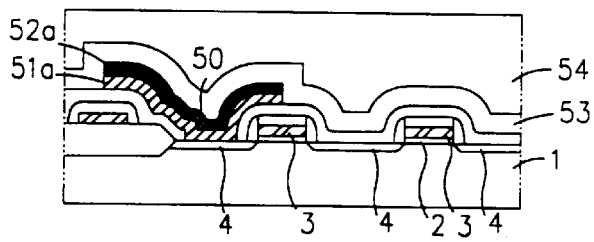

Next, as shown in FIG. 2D, second and third insulating films 53, 54 are sequentially formed over the structure of FIG. 2C. Here, the second insulating film 53 is a silicon oxide film formed by using TEOS and O$_2$ at a temperature of about 700° C. using CVD. The third insulating film 54 formed of boron doped phosphorous silicate glass (BPSG) or phosphorous silicate glass (PSG) is provided for planarization. In addition, a mask pattern (not shown) is formed on the third insulating film 54, the mask pattern having an opening at a location corresponding to the first contact hole 50. Further, a second contact hole 56 is formed by removing portions of the second and third insulating films 53, 54 which are formed at the second contact hole 56. Therefore, second and third insulating film patterns 53a, 54a are formed as shown in FIG. 2E.

Figure 2E:
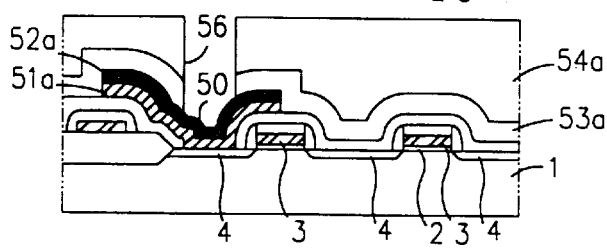
Figure 2F:
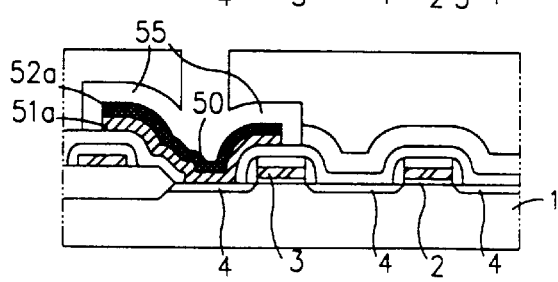

Further, the structure of FIG. 2F is prepared by putting the semiconductor substrate 1 having the structure of FIG. 2E in a HF solution or about 20 to 60 seconds. The substrate 1 is then placed in a buffered oxide etchant (BOE) which is provided by mixing NH$_5$OH with the HF solution for thereby etching the second insulating film pattern 53a. In this process, the SiO$_2$ film of second insulating film pattern formed on the tungsten silicide film pattern 52a is volatilized. Accordingly, a space 55 is formed between the tungsten silicide film pattern 52a and the third insulating film pattern 54a. The reason that the space 55 forms is as follows. As$^+$ ions exist in the first polysilicon layer pattern 51a according to the process shown in FIG. 2B. Thereafter, annealing is performed, so As$^+$ ions diffuse through the tungsten silicide film pattern 52a into the second insulating film 53. Namely, As$^+$ ions exist in a part of the second insulating film 53 formed on the first polysilicon layer pattern 51a.

In FIG. 2E, As$^+$ existing in the second insulating film pattern 53a are combined with F by placing the semiconductor substrate 1 in the HF solution, thereby forming AsF. Since AsF is highly volatile, the portion of the second insulating film pattern 53a which is in contact with the tungsten silicide film pattern 52a is removed. Also, since SiF (formed by combining Si of the silicon oxide film constituting the second insulating film pattern 53a with F in the HF solution) is also volatile, SiF is removed by being volatilized. Thus, the portion of the second insulating film pattern 53a including As$^+$ which is formed on the tungsten silicide film pattern 52a is removed. Accordingly the space 55 is formed between the tungsten silicide film pattern 52a and the third insulating film pattern 54a.

The second insulating film formed on the tungsten silicide film pattern 52a is removed by volatilization according to the present invention, while the insulating film conventionally formed between the polysilicon layers is etched with an etching solution in the conventional fabrication method for a fin-type capacitor. Thus, no problems such as cutting of fins occur, as in the conventional art.

Figure 2G:
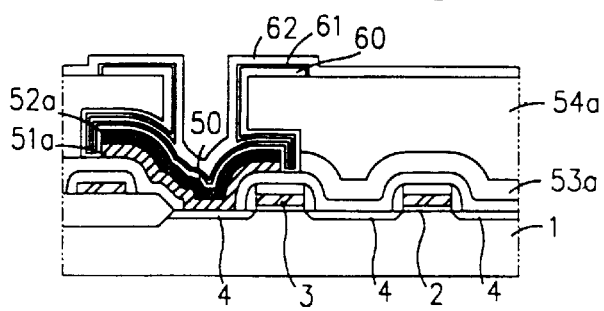

Next, a third polysilicon layer is formed over the structure of FIG. 2F and patterned, thereby forming a lower electrode 60 of the capacitor as shown in FIG. 2G. Here, it is noted that the third polysilicon layer is formed over an inner wall of the space 55 and on side walls of the first contact hole 50. Next, a dielectric layer 61 is formed over the lower electrode 60 of the capacitor, such dielectric layer 61 being formed by depositing a Si$_3$N$_4$ film by CVD or by forming a silicon oxide film by oxidizing the polysilicon layer constituting the lower electrode 60. Next, an upper electrode 62 is formed by depositing a fourth polysilicon layer on the second insulating film pattern 54a and over the dielectric layer 61.

As described above, a capacitor having high capacitance fabricated in accordance with the present invention prevents the cutting of fins that conventionally occurs during removal of the insulating layer formed between the polysilicon layer patterns. This results in an increase in the productivity of the semiconductor device. Also, since the oxide film formed on the tungsten silicide layer is volatilized in the present invention, alignment is improved considerably in the fabrication process. Further, the capacitor fabricated according to the present invention has a relatively large capacitance compared to the conventional art.

It will be apparent to those skilled in the art that various modifications and variations can be made in the fabrication method of the capacitor having high capacitance of the present invention without departing from the spirit or scope of the invention. Thus, it is intended that the present invention cover the modifications and variations of this invention provided they come within the scope of the appended claims and their equivalents.

What is claimed is:

1. A method for fabricating a capacitor on a semiconductor substrate having an impurity region formed thereon, comprising:

forming a first insulating film over the semiconductor substrate having the impurity region formed thereon;

forming a contact hole in the insulating layer so as to expose the impurity region;

forming a first polysilicon layer pattern having a silicide film pattern stacked thereon in a location corresponding to the contact hole;

forming a second insulating film over the stacked first polysilicon layer and silicide film patterns; forming a third insulating film over the second insulating film;

forming a second contact hole in the second and third insulating films to expose the silicide film pattern;

removing a portion of the second insulating film adjacent to the second contact hole to form a space between the silicide film pattern and the third insulating film and expose a portion of the first insulating film adjacent to the stacked first polysilicon layer and silicide film patterns;

forming a first capacitor electrode covering the silicide film pattern, the exposed portion of the first insulating film adjacent to the stacked first polysilicon layer and silicide film patterns, an interior surface of the space formed between the silicide film pattern and the third insulating film, and an interior surface of the second contact hole;

forming a dielectric layer over the first capacitor electrode; and forming a second capacitor electrode over the dielectric layer.

2. The method according to claim 1, wherein the first polysilicon layer pattern is $As^+$ doped.

3. The method according to claim 2, wherein the $As^+$-doped first polysilicon layer pattern is formed by doping the first polysilicon layer pattern with $As^+$ ions at a dose of $1 \times 10^{16}$ to $5 \times 10^{16}$ atoms/cm$^2$ at 80 KeV.

4. The method according to claim 2, further comprising annealing the semiconductor substrate including the $As^+$-doped first polysilicon layer pattern with the silicide film pattern stacked thereon in a manner sufficient to cause $As^+$ to diffuse from the $As^+$-doped first polysilicon layer pattern into the silicide film pattern.

5. The method according to claim 4, wherein in annealing the semiconductor substrate comprises annealing the semiconductor substrate at 850–950° C. for 30 minutes in an $N_2$ atmosphere.

6. The method according to claim 1, wherein the silicide film pattern is a tungsten silicide film pattern.

7. The method according to claim 1, wherein forming the first capacitor electrode comprises forming a second polysilicon layer.

8. The method according to claim 1, wherein forming the dielectric layer comprises forming a $Si_3N_4$ film.

9. The method according to claim 1, wherein forming the dielectric layer comprises forming a silicon oxide layer.

10. The method according to claim 7, wherein forming the dielectric layer comprises forming a silicon oxide film by oxidizing a portion of the second polysilicon layer.

11. The method according to claim 1, wherein forming the second insulating layer comprises forming a silicon oxide film.

12. The method according to claim 11, wherein forming the second insulating film comprises forming a silicon oxide film from TEOS and $O_2$ using chemical vapor deposition.

13. The method according to claim 1, wherein forming the third insulating layer comprises forming one of a borophosphosilicate glass layer and a phosphosilicate glass layer.

14. The method according to claim 4, wherein removing a portion of the second insulating film adjacent to the second contact hole comprises:

after forming the second contact hole in the second and third insulating films, placing the semiconductor substrate in a HF solution; and placing the semiconductor substrate in a buffered oxide etchant.

15. The method according to claim 14, wherein the buffered oxide etchant is obtained by mixing $NH_5OH$ with the HF solution.

16. A method for removing a portion of a silicon oxide layer formed over stacked polysilicon and silicide layers, comprising:

forming the polysilicon layer;

doping the polysilicon layer with a dopant;

forming the silicide layer on the doped polysilicon layer;

annealing the stacked doped polysilicon and silicide layers so that the dopant diffuses from the doped polysilicon layer into the silicide layer;

forming the silicon oxide layer over the stacked doped polysilicon and silicide layers;

forming a contact hole in the silicon oxide layer to expose the silicide layer; and placing the structure in a HF solution to remove a portion of the silicon oxide layer adjacent to the silicide layer.

* * * * *

UNITED STATES PATENT AND TRADEMARK OFFICE
CERTIFICATE OF CORRECTION

PATENT NO.    : 6,114,213
DATED         : September 5, 2000
INVENTOR(S)   : Dong Sun Kim It is certified that error appears in the above-identified patent and that said Letters Patent is hereby corrected as shown below:

Delete claim 16 from the patent.

Signed and Sealed this

Twentieth Day of November, 2001

*Attest:*

*Attesting Officer*

NICHOLAS P. GODICI
*Acting Director of the United States Patent and Trademark Office*